US008873606B2

(12) United States Patent
Zhang et al.

(10) Patent No.: US 8,873,606 B2
(45) Date of Patent: Oct. 28, 2014

(54) TRANSCEIVER INCLUDING A HIGH LATENCY COMMUNICATION CHANNEL AND A LOW LATENCY COMMUNICATION CHANNEL

(71) Applicant: Broadcom Corporation, Irvine, CA (US)

(72) Inventors: Heng Zhang, Irvine, CA (US); Mehdi Khanpour, Irvine, CA (US); Jun Cao, Irvine, CA (US); Chang Liu, Irvine, CA (US); Afshin Momtaz, Laguna Hills, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/671,340

(22) Filed: Nov. 7, 2012

(65) Prior Publication Data

US 2014/0126613 A1 May 8, 2014

(51) Int. Cl.
*H04B 1/38* (2006.01)
*H03D 3/02* (2006.01)

(52) U.S. Cl.
CPC ..................... *H03D 3/02* (2013.01)
USPC .......... 375/219; 375/222; 375/294; 375/295; 375/316; 375/327

(58) Field of Classification Search
USPC ......... 375/219, 220, 222, 229, 259, 289, 294, 375/295, 298, 306, 316, 322, 327, 342, 354, 375/371
See application file for complete search history.

(56) References Cited

U.S. PATENT DOCUMENTS

| 5,644,743 | A  | * | 7/1997 | Barrett et al. ................ 375/375 |
|---|---|---|---|---|
| 7,042,891 | B2 | * | 5/2006 | Oberman et al. ............ 370/412 |
| 7,308,058 | B2 | * | 12/2007 | Zerbe et al. ................ 375/353 |
| 7,584,316 | B2 | * | 9/2009 | Oner ............................ 710/263 |
| 7,715,471 | B2 | * | 5/2010 | Werner et al. ............... 375/232 |
| 7,913,104 | B1 | * | 3/2011 | Cory et al. .................. 713/503 |
| 7,978,802 | B1 | * | 7/2011 | Raha et al. .................. 375/371 |
| 8,090,789 | B1 | * | 1/2012 | O'Shea et al. ............... 709/211 |
| 8,331,519 | B2 | * | 12/2012 | Zhidkov et al. ............. 375/376 |
| 8,384,453 | B1 | * | 2/2013 | Caviglia et al. ............. 327/156 |
| 8,612,711 | B1 | * | 12/2013 | Griffin ........................ 711/165 |
| 2004/0071227 | A1 | * | 4/2004 | Lee ............................ 375/308 |
| 2009/0102523 | A1 | * | 4/2009 | Kim et al. ................... 327/149 |
| 2011/0096884 | A1 | * | 4/2011 | Chatwin ..................... 375/360 |
| 2012/0188885 | A1 | * | 7/2012 | Tazebay et al. ............. 370/252 |
| 2013/0311543 | A1 | * | 11/2013 | Howard ...................... 709/201 |

FOREIGN PATENT DOCUMENTS

WO    WO 2010140133    A2 *   12/2010

* cited by examiner

*Primary Examiner* — Hirdepal Singh
(74) *Attorney, Agent, or Firm* — Fiala & Weaver P.L.L.C.

(57) ABSTRACT

Methods, systems, and apparatuses are described for reducing the latency in a transceiver. A transceiver includes a high latency communication channel and a low latency communication channel that is configured to be a bypass channel for the high latency communication channel. The low latency communication channel may be utilized when implementing the transceiver is used in low latency applications. By bypassing the high latency communication channel, the high latency that is introduced therein (due to the many stages of de-serialization used to reduce the data rate for digital processing) can be avoided. An increase in data rate is realized when the low latency communication channel is used to pass data. A delay-locked loop (DLL) may be used to phase align the transmitter clock of the transceiver with the receiver clock of the transceiver to compensate for a limited tolerance of phase offset between these clocks.

20 Claims, 8 Drawing Sheets

TRANSCEIVER INCLUDING A HIGH LATENCY COMMUNICATION CHANNEL AND A LOW LATENCY COMMUNICATION CHANNEL

BACKGROUND

1. Technical Field

The present invention relates to communication systems, and in particular, to reducing latency in transceivers.

2. Background Art

Communication systems for transmitting data may operate according to a number of standards and implementations. Such communication systems may include one or more communication channels for transmitting and receiving data. Some of such communication channels may include a transceiver that receives serial data, converts the serial data to parallel data, digitally processes the parallel data, serializes the processed data, and transmits the serialized data. Such a transceiver may be referred to as a SERDES (serializer/deserializer) transceiver. SERDES transceivers may be used in a wide range of communication systems and devices, such as mobile devices, desktop computers and servers, computer networks, and telecommunication networks.

A SERDES transceiver may be capable of handling very high data rates. For instance, a multi-gigabit SERDES transceiver may be capable of receiving an analog serial data stream at data rates over 1 Gigabit-per-second. Multi-gigabit transceivers are used increasingly for data communications because they can be used over longer distances and use fewer wires.

One disadvantage with multi-gigabit transceivers, however, is that they suffer from high latency due to the fact that the incoming high speed signal has to go through many stages of de-serialization to reduce the data rate to be low enough for the digital processing that occurs within the SERDES. For example, a multi-gigabit transceiver receiving an analog serial data stream at 10 Gigabits-per-second is typically de-serialized down to parallel data at 500 Megabits-per-second. In other words, the analog serial data stream is de-serialized at a ratio of 1:20. For multi-gigabit transceivers receiving an analog serial data stream at even faster rates, the ratio increases (e.g., to 1:32, 1:64). This high latency becomes an ever-increasing problem as the market demands increasingly higher data rates.

BRIEF SUMMARY

Methods, systems, and apparatuses are described for reducing latency in a SERDES transceiver, substantially as shown in and/or described herein in connection with at least one of the figures, as set forth more completely in the claims.

BRIEF DESCRIPTION OF THE DRAWINGS/FIGURES

The accompanying drawings, which are incorporated herein and form a part of the specification, illustrate embodiments and, together with the description, further serve to explain the principles of the embodiments and to enable a person skilled in the pertinent art to make and use the embodiments.

Embodiments will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION

Introduction

Figure 1:
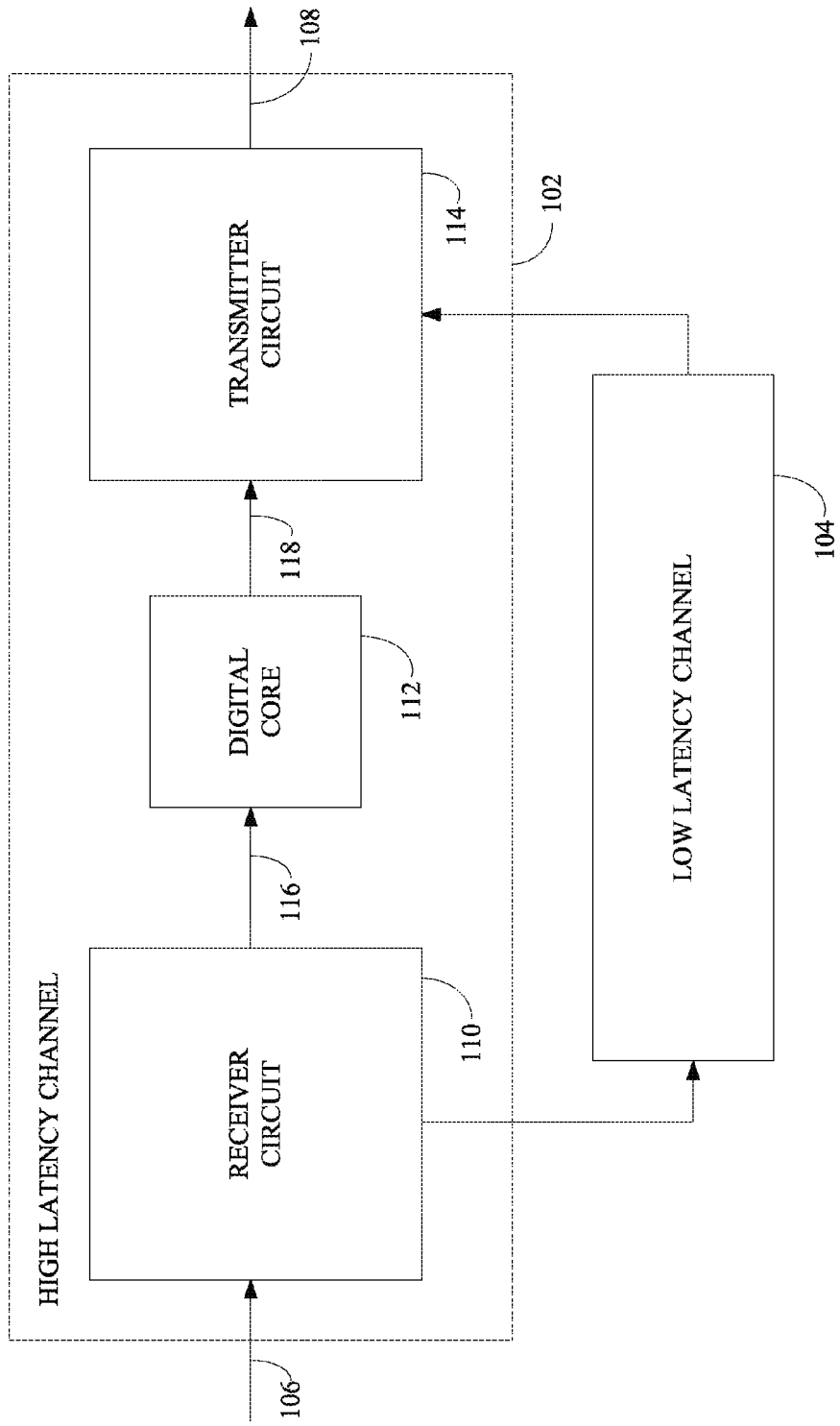
FIG. 1 depicts a block diagram of a transceiver including a high latency communication channel and a low latency communication channel, according to an example embodiment.

The present specification discloses numerous example embodiments. The scope of the present patent application is not limited to the disclosed embodiments, but also encompasses combinations of the disclosed embodiments, as well as modifications to the disclosed embodiments.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Furthermore, it should be understood that spatial descriptions (e.g., "above," "below," "up," "left," "right," "down," "top," "bottom," "vertical," "horizontal," etc.) used herein are for purposes of illustration only, and that practical implementations of the structures described herein can be spatially arranged in any orientation or manner.

Numerous exemplary embodiments are described as follows. It is noted that any section/subsection headings provided herein are not intended to be limiting. Embodiments are described throughout this document, and any type of embodiment may be included under any section/subsection. Furthermore, disclosed embodiments may be combined with each other in any manner.

In embodiments, a transceiver is described herein that includes a high latency communication channel and a low latency communication channel that is configured to be a bypass channel for the high latency communication channel. The low latency communication channel may be utilized when implementing the transceiver in applications where low latency for data is desired. By bypassing the high latency communication channel, the high latency introduced due to the many stages of de-serialization that is performed in the high latency communication channel (e.g., to reduce the data rate for digital processing that occurs within the transceiver) can be avoided, and an increase in data rate is realized by alternately using the low latency communication channel. In an embodiment, a delay-locked loop (DLL) may be used to phase align the transmitter clock of the transceiver with the receiver clock of the transceiver to compensate for the limited tolerance of phase offset between these clocks.

In particular, transceiver embodiments are described herein. For instance, in one embodiment, a transceiver includes a high latency communication channel and a low latency communication channel that is a bypass channel for the high latency communication channel. The high latency channel includes a digital core, a receiver circuit, and a transmitter circuit. The receiver circuit is configured to convert a serial input signal to first parallel signals. The low latency communication channel includes a demultiplexor and a first-in first-out (FIFO). The demultiplexor is configured to convert the first parallel signals to second parallel signals. The FIFO is configured to receive and buffer the second parallel signals according to a FIFO depth and output a delayed version of the second parallel signals. In an embodiment, the FIFO may have a programmable FIFO depth. The transceiver is configured to select one of the first parallel signals from the high latency communication channel or the delayed version of the second parallel signals from the low latency communication channel for conversion to a serial output signal.

Methods are also described herein. In accordance with an example method, a serial input signal is converted to first parallel signals in a high latency communication channel of a transceiver. The first parallel signals are converted to second parallel signals in a low latency communication channel of the transceiver. The low latency communication channel is a bypass channel for the high latency communication channel. The second parallel signals are buffered in a FIFO of the low latency communication channel according to a FIFO depth. In an embodiment, the FIFO may have a programmable FIFO depth. The FIFO outputs a delayed version of the second parallel signals. One of the first parallel signals from the high latency communication channel or the delayed version of the second parallel signals from the low latency communication channel are selected for conversion to a serial output signal.

Furthermore, systems and methods for phase aligning receiver and transmitter clock signals are provided. According to one embodiment, a first clock signal is received from a first phase interpolator (e.g., a phase interpolator for the receiver). A second clock signal is received from a second phase interpolator (e.g., a phase interpolator for the transmitter). A phase difference is detected between the first clock signal and the second clock signal. A phase difference signal is transmitted to a digital core in response to detecting a phase difference between the first clock signal and the second clock signal. A control signal is received from the digital core. The control signal is generated using at least the phase difference signal. The second clock signal is phase adjusted by the second phase interpolator according to the control signal.

Example Transceiver Including a High Latency Communication Channel and a Low Latency Communication Channel FIG. 1 depicts a high-level block diagram of a transceiver 100 including a high latency communication channel 102 and a low latency communication channel 104, according to an embodiment. In an embodiment, transceiver 100 is a SER-DES transceiver. As shown in FIG. 1, high latency communication channel 102 may include a receiver circuit 110, a digital core 112, and a transmitter circuit 114.

Receiver circuit 110 may be a high-speed analog serial data interface configured to receive data via an analog serial input signal 106. Digital core 112 may be configured to operate at a much slower speed than receiver circuit 110. As such, receiver circuit 110 may be configured to de-serialize serial input signal 106 by converting analog serial input signal 106 into an N number of parallel signals 116, where N is any integer value greater than or equal to 2. Each signal of parallel signals 116 has a data rate equal to R/N, where R is the data rate of the received analog serial input signal 106. Therefore, the combined data rate of parallel signals 116 is equal to the data rate of analog serial input signal 106. For example, suppose the data rate for analog serial input signal 106 is 10 Gigabits per second (Gbps), and suppose that receiver circuit 110 converts analog serial input signal 106 to a 20-bit parallel signal (i.e., 20 parallel signals). In this example, each signal of the 20-bit parallel signal has a data rate of 500 Megabits per second (Mbps).

Digital core 112 may receive parallel signals 116. In one embodiment, receiver circuit 110 converts parallel signals 116 to digital signals before providing parallel signals 116 to digital core 112. In another embodiment, receiver circuit 110 provides parallel signals 116 to digital core 112 as analog signals, where digital core 112 may convert parallel signals 116 to digital signals. Digital core 112 may buffer parallel signals 116 (as digital signals) in a FIFO (not depicted) having a FIFO depth of N. Digital core 112 may generate a delayed (and optionally processed) version of parallel signals 116 (depicted as signals 118) according to the FIFO depth, and provides delayed parallel signals 118 to transmitter circuit 114. Digital core 112 may also include a clock and data recovery module (not depicted) that recovers a clock signal from analog serial input signal 106. The recovered clock signal represents received signal timing (e.g., the timing of data symbols received via serial input signal 106). Digital core 112 may further include logic for enabling the phase adjustment of one or more clock signals of transceiver 100, as further discussed below. Digital core 112 may include further functionality (e.g., the removal of error correction and packet protocol bits from parallel signals 116, error correction used to correct errors detected in received bits, and/or bit stuffing) as would be known to persons skilled in relevant art(s). However, such additional functionality is not described for purposes of brevity.

Transmitter circuit 114 may be a high-speed analog serial data interface configured to transmit data via an analog serial output signal 108. Transmitter circuit 114 may be configured to receive delayed parallel signals 118. In one embodiment, digital core 112 converts delayed parallel signals 118 back to analog signals before providing parallel signals 116 to transmitter circuit 114. In another embodiment, digital core 110 provides delayed parallel signals 118 to transmitter circuit 114 as digital signals, where transmitter circuit 114 converts delayed parallel signals 118 to analog signals. Transmitter circuit 114 may be configured to serialize delayed parallel signals 118 by converting delayed parallel signals 118 into analog serial output signal 108, which has the original data rate as the analog serial input signal 106 (e.g., 10 Gbps).

The latency introduced by converting analog serial input signal 106 into parallel signals 116, buffering parallel signals 116, and converting delayed parallel signals 118 to analog serial output signal 108 are major contributing factors for the high latency of high latency communication channel 102. This high latency is undesirable in ultra-low latency applications. As such, when implementing transceiver 100 in a low (including ultra-low) latency application, high latency communication channel 102 may be bypassed using low latency communication channel 104. Low latency communication channel 104 may be configured to receive analog serial input signal 106. In one embodiment, low latency communication channel 104 passes analog serial input signal 106 directly to analog serial output signal 106, thereby avoiding any latency incurred from de-serializing analog serial input signal 106 into parallel signals 116, buffering parallel signals 116, and serializing delayed parallel signals 118. In another embodiment, low latency communication channel 106 de-serializes analog serial input signal 106 (which may have been partially de-serialized by high latency communication channel 102) into an M number of parallel signals (not depicted) and buffers parallel signals (either as analog signals or digital signals) into a FIFO (not depicted) having a FIFO depth of M, where M is an integer value less than N. That is, the FIFO depth of the FIFO included in low latency communication channel 104 is less than the FIFO depth of the FIFO included in high latency communication channel 102. Because analog serial input signal 106 is de-serialized to a lesser extent than in high latency communication channel 102 (enabled by an absence of a slower-operating digital core), the number of parallel signals to buffer in the FIFO in low latency communication channel 104 is also reduced. Accordingly, the latency incurred by low latency communication channel 104 is less than the latency incurred by high latency communication channel 102.

Figure 2:
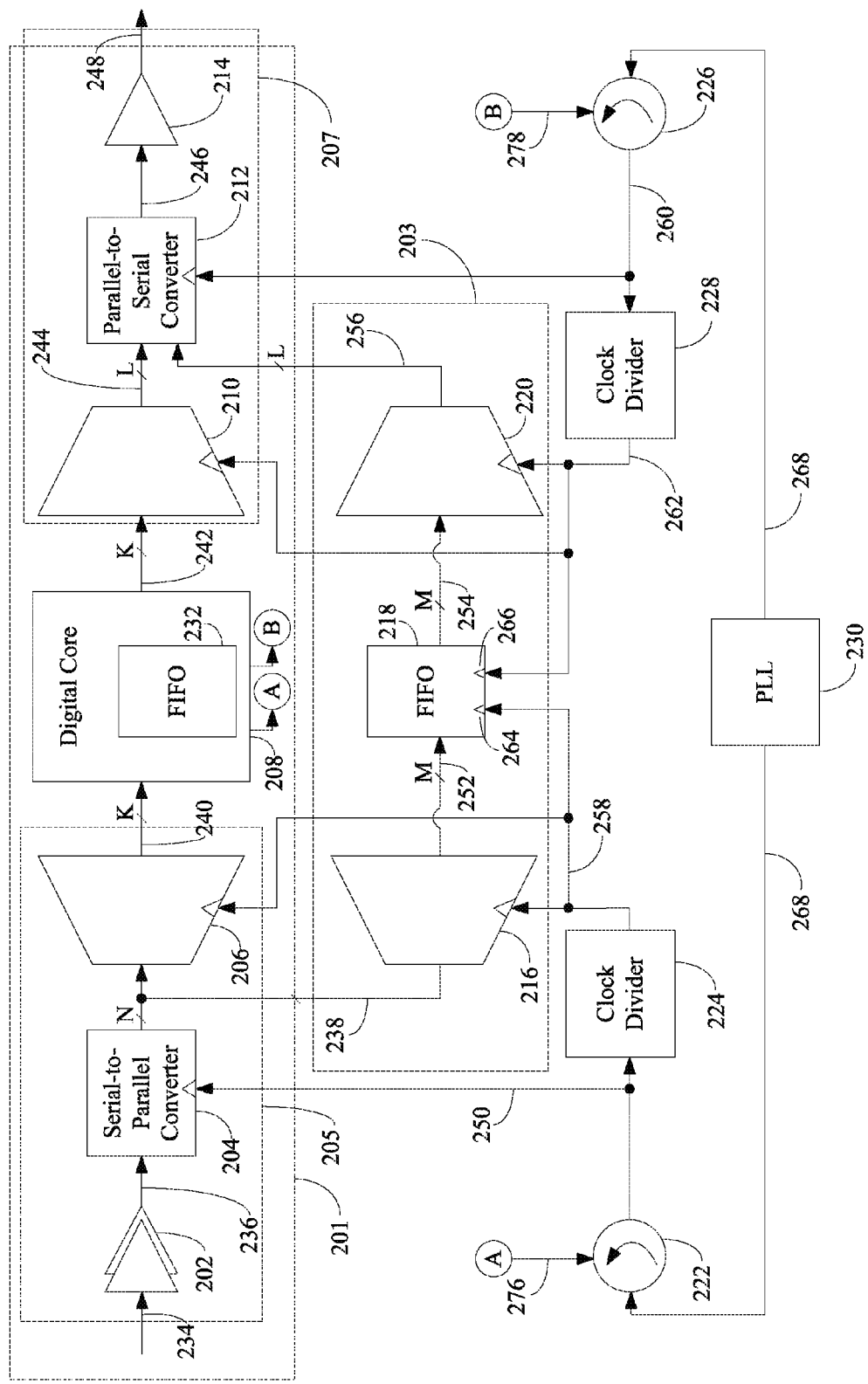
FIG. 2 depicts a detailed block diagram of an example of the transceiver of FIG. 1, according to an embodiment.

Transceiver 100 of FIG. 1 may be implemented in various ways, in embodiments. For instance, FIG. 2 depicts a detailed block diagram of a transceiver 200, according to an embodiment. Transceiver 200 is an example of transceiver 100. In one embodiment, transceiver 200 is a SERDES transceiver. As shown in FIG. 2, transceiver 200 may include a first phase interpolator 222, a first clock divider 224, a second phase interpolator 226, a second clock divider 228, and a phase-locked loop (PLL) 230. Transceiver 200 may also include a first communication channel 201 and a second communication channel 203. First communication channel 201 may be a high latency communication channel, and is an example of high latency communication channel 102 of FIG. 1. First communication channel 201 may include a receiver circuit 205, a digital core 208, and a transmitter circuit 207. Receiver circuit 205 of first communication channel 201 is an example of receiver circuit 110 (FIG. 1) and may include one or more amplifier(s) 202, a serial-to-parallel converter 204, and a first demultiplexor (demux) 206. Transmitter circuit 207 is an example of transmitter circuit 114 (FIG. 1) may include a first multiplexor (mux) 210, a parallel-to-serial converter 212, and a driver 214. Digital core 208 is an example of digital core 112 of FIG. 1. Second communication channel 203 may be a low latency communication channel, and is an example of low latency communication channel 104 of FIG. 1. Second communication channel 203 may include a second demux 216, a FIFO 218, and a second mux 220. Transceiver 200 is described as follows.

Transceiver 200 may receive a master clock signal 268. Master clock signal 268 may be generated by PLL 230. First phase interpolator 222 may receive master clock signal 268 and output a receiver clock signal 250, which is a phase adjusted version of master clock signal 268. First phase interpolator 222 may phase adjust master clock signal 268 in accordance to a first control signal 276 received from digital core 208. Additional details concerning first control signal 276 are provided below in reference to FIG. 7.

Receiver clock signal 250 may be received by serial-to-parallel converter 204, as discussed further below. First clock divider 224 may receive receiver clock signal 250 as an input and may output a divided receiver clock signal 258. Divided receiver clock signal 258 may be generated by dividing a frequency of master clock signal 268 by a number of signals or bit width of first parallel signals 238, as discussed further below. Divided receiver clock signal 258 may be received by first demux 206 of first communication channel 201, second demux 216 of second communication channel 203, and a write clock input 264 of FIFO 218, as discussed further below.

Second phase interpolator 226 may receive master clock signal 268 and output a transmitter clock signal 260, which is a phase adjusted version of master clock signal 268. Second phase interpolator 226 may phase adjust master clock signal 268 in accordance to a second control signal 278 received from digital core 208. Additional details concerning second control signal 278 is provided below in reference to FIG. 7.

Transmitter clock signal 260 may be received by parallel-to-serial converter 212, as discussed further below. Second clock divider 228 may receive transmitter clock signal 260 as an input and may output a divided transmitter clock signal 262. Divided transmitter clock signal 262 may be generated by dividing a frequency of master clock signal 268 by the number of signals or bit width of fifth parallel signals 256, as discussed further below. Divided transmitter clock signal 262 may be received by first mux 210 of first communication channel 201, second mux 220 of second communication channel 203, and a read clock input 266 of FIFO 218, as discussed further below.

Receiver circuit 205 of first communication channel 201 may be a high-speed analog serial data interface configured to receive an analog serial input signal. For example, as shown in FIG. 2, receiver circuit 205 may be configured to receive analog serial input signal 234. Analog serial input signal 234 may be input into amplifier(s) 202, which are configured to increase the power of analog serial input signal 234 to generate an amplified version of analog serial input signal (depicted as signal 236). In an embodiment, amplifier(s) 202 may be one or more variable gain amplifier(s). Amplified analog serial input signal 236 may be received by serial-to-parallel converter 204.

Serial-to-parallel converter 204 may be configured to sample amplified analog serial input signal 236 according to receiver clock signal 250, which is phase adjusted such that amplified analog serial input signal 236 is sampled at as close to an optimal sampling point (i.e., the center of a data "eye" diagram) as possible, and convert amplified analog serial input signal 236 to an N number of first parallel signals 238. The number of parallel signals to which amplified analog serial input signal 236 is converted may be in accordance to a conversion ratio associated with serial-to-parallel converter 204. The conversion ratio may be defined by the number of inputs coming into serial-to-parallel converter 204 and the number of outputs coming out of serial-to-parallel converter 204. Each signal of first parallel signals 238 has a data rate equal to R/N, where R is the data rate of the received analog serial input signal 234. Therefore, the combined data rate of first parallel signals 238 is equal to the data rate of analog serial input signal 234. For example, suppose the data rate for analog serial input signal 234 is 10 Gbps, and suppose that the conversion ratio for serial-to-parallel converter 204 is 1:2. In this example, serial-to-parallel converter 204 converts amplified analog serial input signal 236 to a 2-bit parallel signal (i.e., two parallel signals), where each signal of the 2-bit parallel signal has a data rate of 5 Gbps.

First demux 206 may be configured to receive and further parallelize N first parallel signals 238 by converting N first parallel signals 238 to a K number of second parallel signals 240, where K is an any integer value greater than N. The number of parallel signals to which first parallel signals 238 are converted may be in accordance to a first demux ratio associated with first demux 206. The first demux ratio may be defined by the number of inputs coming into first demux 206 and the number of outputs coming out of first demux 206. For instance, with continued reference to the 10 Gbps example described above, suppose the demux ratio is 2:20. In this case, first demux 206 receives a 2-bit parallel signal (i.e., first parallel signals 238) and converts the 2-bit parallel signal to a 20-bit parallel signal (i.e., second parallel signals 240), where each signal of the 20-bit parallel signal has a data rate of 500 Megabits per second (Mbps). First demux 206 may be configured to sample first parallel signal 238 in accordance to divided receiver clock signal 258. The frequency of divided receiver clock signal 258 is such that analog parallel signal 238 is sampled in accordance to the parallel data rate of first parallel signals 238 to maintain the overall data rate (e.g., 10 Gbps) of transceiver 200. In the example above, the frequency of divided receiver clock signal 258 is the frequency of receiver clock signal 250 divided by 2 (i.e., bit width of first parallel signals 238 received by first demux 206).

Digital core 208 may be configured to receive K second parallel signals 240. Digital core 208 may buffer K second parallel signals 240 in a FIFO 232 having a FIFO depth of K (i.e., the bit width of second parallel signals 240) or other depth. Digital core 208 may generate a delayed version of second parallel signals 240 (depicted as signals 242) according to the FIFO depth and provide delayed second parallel signals 242 to transmitter circuit 207 of first communication channel 201. Digital core 208 may also include a clock and data recovery module (not depicted) that recovers a clock signal from analog serial input signal 234. The recovered clock signal represents received signal timing (e.g., the timing of data symbols received via analog serial input signal 234). Digital core 208 may further include logic for enabling the phase adjustment of one or more clock signals (e.g., receiver clock signal 250 and/or transmitter clock signal 260) of transceiver 200. The phase adjustment for receiver clock signal 250 may be based on at least the recovered clock signal, as would be known to persons skilled in the relevant art(s). In one embodiment, the phase adjustment for transmitter clock signal 260 is based on at least the recovered clock signal. In another embodiment, the phase adjustment for transmitter clock signal 260 may be based on receiver clock signal 250. In response to determining a phase adjustment is needed, digital core 208 may provide first control signal 276 to first phase interpolator 222 and second control signal 278 to second phase interpolator 226. First control signal 276 and second control signal 278 indicate the number of degrees (e.g., 0 to 360 degrees, or additional degrees) that master clock signal 268 is to be adjusted. Additional details regarding the phase adjustment operations performed by digital core 208 is discussed below with reference to FIGS. 7-8. Digital core 208 may include further functionality (e.g., the removal of error correction and packet protocol bits from K parallel signals 240, error correction, and/or bit stuffing) to process second parallel signals 240 as would be known to persons skilled in relevant art(s). However, such additional functionality is not described for purposes of brevity.

In an embodiment, first demux 206 includes an analog-to-digital (A/D) converter (not depicted) that converts K second parallel signals 240 to digital signals before providing K second parallel signals 240 to digital core 208. In another embodiment, digital core 208 receives K second parallel signals 240 as analog signals and converts second parallel signals 240 into digital signals (e.g., via an A/D converter included therein) before buffering K second parallel signals 240 in FIFO 232. Furthermore, in embodiments, serial-to-parallel converter 204 may be implemented in various ways, including as a slicer, a sampler, a decision circuit, or in other ways, as would be known to persons skilled in the relevant art(s).

Transmitter circuit 207 of first communication channel 201 may be a high-speed analog serial data interface configured to transmit an analog serial output signal at the same data rate at which analog serial input signal 234 was received. For example, as shown in FIG. 2, first mux 210 may be configured to receive K delayed second parallel signals 242. First mux 210 may be configured to receive and convert K delayed second parallel signals 242 into L third parallel signals, where L is any integer value less than K. In one embodiment, L is the same value as N. L third parallel signals 244 may be received by parallel-to-serial converter 212. The number of parallel signals to which delayed K second parallel signals 242 are converted may be in accordance to a second mux ratio associated with second mux 210. The second mux ratio may be defined by the number of inputs coming into second mux 210 and the number of outputs coming out of second mux 210. For instance, with continued reference to the 10 Gbps example above, suppose the first mux ratio is 20:2. In this case, first mux 210 receives and converts a 20-bit parallel signal (i.e., delayed K second parallel signals 242) to a 2-bit parallel signal (i.e., L third parallel signals 244), where each signal of the 2-bit parallel signal has a data rate of 5 Gbps. First mux 210 may be configured to sample delayed K second parallel signals 242 in accordance to divided transmitter clock signal 262. The frequency of divided transmitter clock signal 262 is such that delayed K second parallel signal 242 is sampled in accordance to the parallel data rate at which L third parallel signals 244 are outputted to maintain the overall data rate of transceiver 200. In the example above, the frequency of divided transmitter clock signal 262 is the frequency of transmitter clock signal 260 divided by 2 (i.e., the number of signals or bit width of L third parallel signals 244 outputted by first mux 210).

Parallel-to-serial converter 212 may be configured to sample one of L third parallel signals 244 or L fifth parallel signals 256 received from second communication channel 203 (as further described below) according to transmitter clock signal 260 that is phase adjusted such that L third parallel signals 244 or L fifth parallel signals 256 are sampled at the optimal sampling point (i.e., the center of the data eye diagram). Parallel-to-serial converter 212 may convert L third parallel signals 244 or L fifth parallel signals 256 to a serial output signal 246. Parallel-to-serial converter 212 may provide serial output signal 246 to driver 214. The number of parallel signals to convert to serial output signal 246 may be in accordance to a conversion ratio associated with parallel-to-serial converter 212. The conversion ratio may be defined by the number of inputs coming into parallel-to-serial converter 212 and the number of outputs coming out of parallel-to-serial converter 212. For example, with continued reference to the 10 Gbps example, suppose the conversion ratio associated with parallel-to-serial converter 212 is 2:1. In this example, parallel-to-serial converter 212 converts a 2-bit parallel signal (i.e., L third parallel signals 244 or L fifth parallel signals 256) to a serial output signal (i.e., serial output signal 246), where serial output signal 246 has a data rate of 10 Gbps.

In an embodiment, first mux 210 includes an A/D converter (not depicted) that converts K third parallel signals 242 to analog signals before providing L third parallel signals 244 to parallel-to-serial converter 212. In another embodiment, parallel-to-serial converter 212 receives L third parallel signals 244 as digital signals and converts L third parallel signals 244 into analog signals (e.g., via an A/D converter included therein) before providing analog serial output signal 246 to driver 214.

Driver 214 may be configured to increase the power of analog serial output signal 246 to generate an amplified version of analog serial output signal (depicted as signal 248). Driver 214 may be configured to provide amplified analog serial output signal 248 to a signal line or device (not depicted) coupled to transceiver 200.

As shown in FIG. 2, transceiver 200 includes second communication channel 203. Second communication channel 203 may be a low latency communication channel that is configured to be a bypass channel for the high latency communication channel (i.e., first communication channel 201). The high latency introduced by converting analog serial input signal 236 into K second parallel signals 240, buffering the K second parallel signals 240, and converting delayed K second parallels signals 242 to serial output signal 246 is undesirable in ultra-low latency applications. As such, when implementing transceiver 200 in a low latency application, first communication channel 201 may be bypassed using second communication channel 203.

Second demux 216 may be configured to receive N first parallel signals 238 from serial-to-parallel converter 204 of first communication channel 201. Second demux 216 may be configured to convert N first parallel signals 238 to an M number of fourth parallel signals 252, where M is an any integer value less than K, but greater than or equal to N. That is, second demux 216 may be configured to convert N first parallel signals 238 to a smaller number of parallel signals than first demux 206. The number of parallel signals to which N first parallel signals 238 are converted by second demux 216 may be in accordance to a second demux ratio associated with second demux 216. The second demux ratio may be defined by the number of inputs coming into demux 216 and the number of outputs coming out of demux 216. The second demux ratio may be selectable (e.g., via a configuration operation to a configuration register (not depicted)), thereby allowing the second demux ratio to be tuned to achieve the desired latency.

For instance, with continued reference to the 10 Gbps example above, suppose the selected second demux ratio is 2:4. In this case, second demux 216 receives a 2-bit parallel signal (i.e., N first parallel signals 238) and converts the 2-bit parallel signal to a 4-bit parallel signal (i.e., M fourth parallel signals 252), where each signal of the 4-bit parallel signals has a data rate of 2.5 Gbps (which is considerably faster than the 500 Mbps data rate of K second parallel signals being output from demux 206). Second demux 216 may be configured to sample N first parallel signal 238 in accordance to divided receiver clock signal clock signal 258. The frequency of divided receiver clock signal 258 is such that analog parallel signal 238 is sampled in accordance to the parallel data rate of first parallel signals 238 to maintain the overall data rate of transceiver 200. In the example above, the frequency of divided receiver clock signal 258 is the frequency of receiver clock signal 250 divided by 2 (i.e., the bit width of N first parallel signals 238 received by second demux 216).

It is noted that the 2:4 ratio selected for the second demux ratio above is purely exemplary and that other second demux ratios may be selected (e.g., via a configuration operation to a configuration register (not depicted)). Other second demux ratios include, but are not limited to, 2:2, 2:6, 2:8, 2:10, 2:12, 2:14, 2:16 and 2:18.

FIFO 218 may be configured to receive M fourth parallel signals 252, where M is less than K. That is, the FIFO depth of the FIFO 218 included in second communication channel 203 is less than the FIFO depth of FIFO 232 included in first communication channel 201. FIFO 218 may buffer M fourth parallel signals 252 in accordance to a selectable FIFO depth of M (i.e., the number of fourth parallel signals 252 being output from second demux 216). M fourth parallel signals 252 may either be analog signals or digital signals. For example, in an embodiment, second demux 216 includes an analog-to-digital (A/D) converter (not depicted) that converts first parallel signals 238 to digital signals before providing M fourth parallel signals 252 to FIFO 218. In another embodiment, FIFO 218 receives M fourth parallel signals 252 as analog signals and converts M fourth parallel signals 252 into digital signals (e.g., via an A/D converter included therein) before buffering M fourth parallel signals 252 in FIFO 218.

Figure 3:
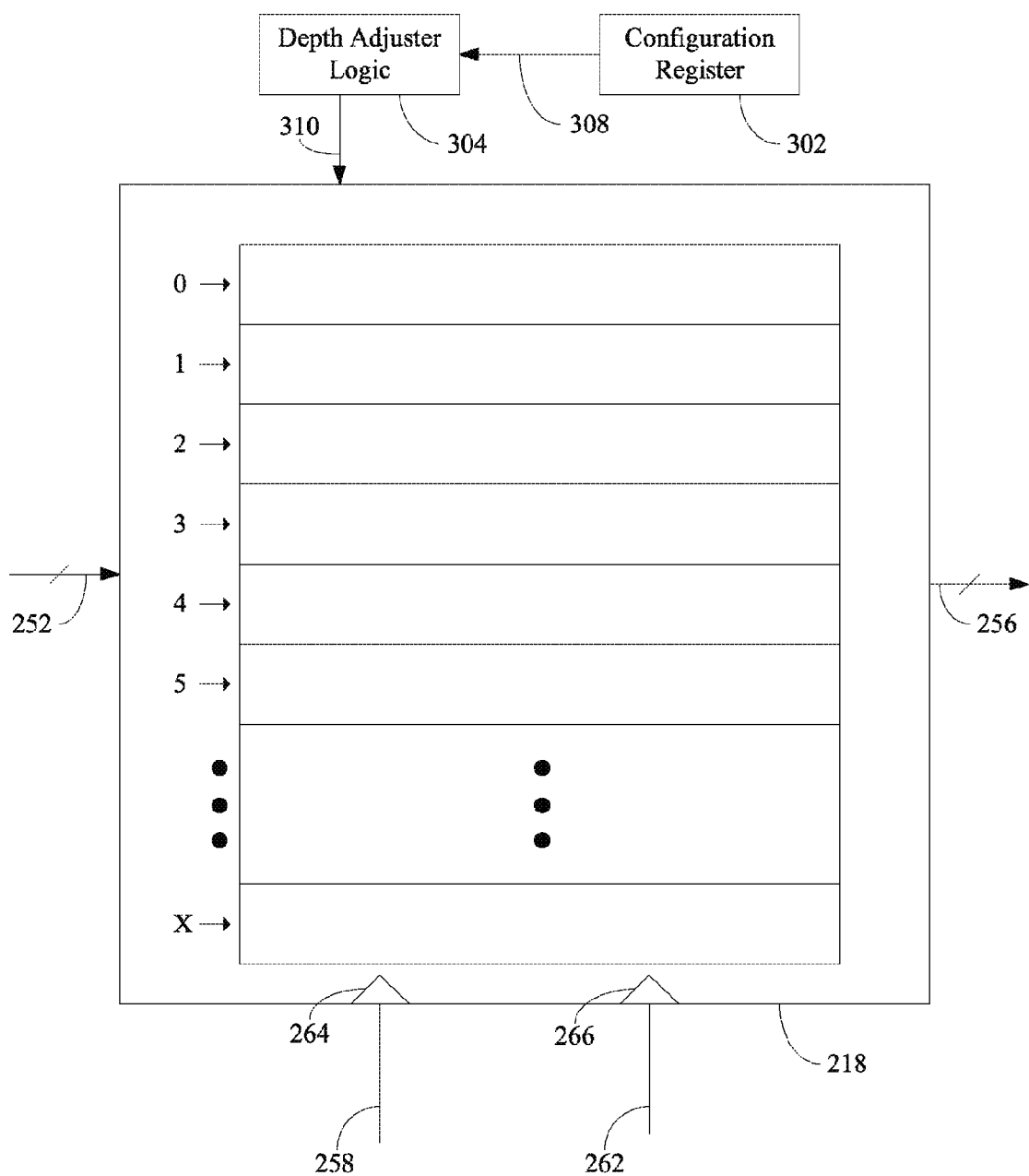
FIG. 3 depicts a block diagram of a programmable first-in first-out (FIFO) logic device, according to an embodiment.

FIFO 218 may be configured in various ways, in embodiments. For instance, FIG. 3 depicts a block diagram of FIFO 218, in accordance to an embodiment. As shown in FIG. 3, FIFO 218 may include a plurality of buffers O-X. Each buffer is configured to store a data word received on a respective one of M fourth parallel signals 252. The number of buffers available to store data words may be selectable via a configuration operation received by transceiver 200. As such, in an embodiment, FIFO 218 may have a programmable FIFO depth.

For example, FIFO 218 may be coupled (either directly or indirectly) to configuration register 302 and depth adjuster logic 304. Configuration register 302 may be configured to receive a configuration write operation that writes a value indicative of the selected FIFO depth of FIFO 218. The FIFO depth represents the number of buffers in FIFO 218 that are to be available to store data words received via M fourth parallels signals 252. Configuration register 302 may be configured to provide a FIFO depth selection signal 308 that indicates the desired FIFO depth to depth adjuster logic 304. In response to receiving FIFO depth selection signal 308, depth adjuster logic 304 may modify the number of buffers that are made available in FIFO 218 (e.g., via modification signal 310).

The FIFO depth may be selected to match the number of M fourth parallel signals 252 being output from second demux 216. For example, using the example above, FIFO depth may be selected to be 4 to match the 4-bit parallel signal being output form second demux 216. It is noted that the FIFO depth mentioned above is purely exemplary and that other FIFO depths may be selected (e.g., via a configuration operation to configuration register 302). Other FIFO depths include, but are not limited to, 2, 6, 8, 10, 12, 14, 16 and 18).

FIFO 218 may be configured to store data words received via M fourth parallel signals 252 in the buffers in accordance to divided receiver clock signal 258 received via write clock input 264 of FIFO 218. FIFO 218 may be configured to provide a delayed version of data words via a delayed version of M fourth parallel signals (depicted as signals 256) to parallel-to-serial converter 212 (FIG. 2) of first communication channel 201 in accordance to divided transmitter clock signal 262 received via a write clock input 266.

Referring again to FIG. 2, second mux 220 may be configured to receive M delayed fourth parallel signals 254. Second mux 220 may be configured to receive and convert M delayed fourth parallel signals 254 into L fifth parallel signals, where L is any integer value less than M. In one embodiment, L is the same value as M. L fifth parallel signals 256 may be received by parallel-to-serial converter 212 of first communication channel 201. The number of parallel signals to which delayed M fourth parallel signals 254 are converted may be in accordance to a second mux ratio associated with second mux 220. The second mux ratio may be defined by the number of inputs coming into second mux 220 and the number of outputs coming out of second mux 220. The second mux ratio may be selectable (e.g., via a configuration operation (not depicted)), thereby allowing the demux ratio to be tuned to achieve the desired latency.

For instance, with continued reference to the 10 Gbps example above, suppose the selected second mux ratio is 4:2. In this case, mux 220 receives and converts a 4-bit parallel signal (i.e., delayed M fourth parallel signals 254) to a 2-bit parallel signal (i.e., L fifth parallel signals 256), where each signal of the 2-bit parallel signal has a data rate of 5 Gbps. Mux 220 may be configured to sample delayed M fourth parallel signal 254 in accordance to divided transmitter clock signal 262. The frequency of divided transmitter clock signal 262 is such that delayed M fourth parallel signal 254 is sampled in accordance to the parallel data rate at which L fifth parallel signals 256 are outputted to maintain the overall data rate of transceiver 200. In the example above, the frequency of divided transmitter clock signal 262 is the frequency of transmitter clock signal 260 divided by 2 (i.e., the bit width of L fifth parallel signals 256 outputted by second mux 220).

It is noted that the 4:2 ratio selected for the second mux ratio above is purely exemplary and that other second mux ratios may be selected (e.g., via a configuration operation). Other second mux ratios include, but are not limited to, 18:2, 16:2, 14:2, 12:2, 10:2, 8:2, 6:2, and 2:2.

Parallel-to-serial converter 212 of first communication channel 201 may be configured to receive L fifth parallel signals 256. As mentioned above, parallel-to-serial converter 212 may be configured to select either one of L third parallel signals 244 or L fifth parallel signals 256 for conversion to a serial output signal 246. The determination as to whether parallel-to-serial converter 212 is to select L third parallel signals 244 or fifth parallel signals 256 may be based on a mode select signal (not depicted) received by parallel-to-serial converter 212. The mode select signal may indicate whether transceiver 200 is to execute in a high latency mode or a low latency mode. For example, if mode select signal is a first value (e.g., "0" (zero)), then transceiver 200 may be configured to execute in high latency mode, where analog serial input signal 234 is de-serialized and serialized via first communication channel 201. In high latency mode, parallel-to-serial converter 212 may be configured to select L third parallel signals 244 for conversion to serial output signal 246. If mode select signal is a second value (e.g., "1" (one)), then transceiver 200 may be configured to execute in low latency mode, where analog serial input signal 234 is de-serialized and serialized at least in part by second communication channel 203. In low latency mode, parallel-to-serial converter 212 may be configured to select L fifth parallel signals 256 for conversion to serial output signal 246. It is contemplated that in various embodiments, according to design considerations, mode select signal maybe a "1" to indicate high latency mode and a "0" to indicate low latency mode.

Because an analog serial input signal is de-serialized to a lesser extent in second communication channel 203 than in first communication channel 201 (e.g., 1:20 vs. 1:4), the number of parallel signals to buffer in FIFO 218 of second communication channel 203 compared to the number of parallel signals to buffer in FIFO 232 of first communication channel 201 is also reduced (e.g., 20 vs. 4). Accordingly, the latency incurred via second communication channel 203 is less than the latency incurred via first communication channel 201. As such, it may be desirable to bypass first communication channel 201 using second communication channel 203 in certain instances, e.g., when implementing transceiver 200 in an ultra-low latency application.

Figure 4:
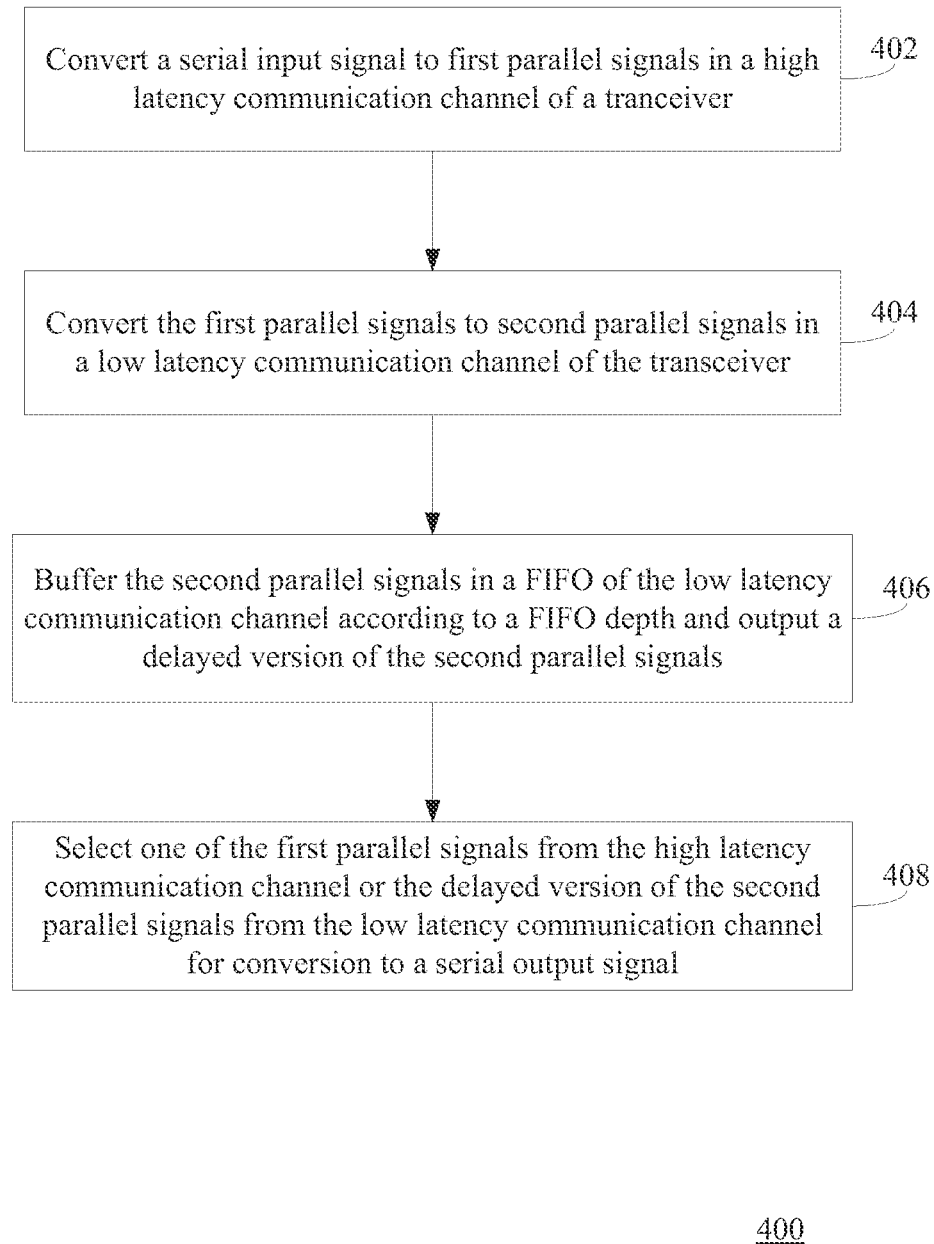
FIG. 4 shows a flowchart providing example steps for processing an analog serial input signal via a low latency communication channel, according to an example embodiment.

Accordingly, in embodiments, the above-described transceivers may operate in various ways to process an analog serial input signal via a low latency communication channel. For example, FIG. 4 shows a flowchart 400 providing example steps for processing an analog serial input signal via a low latency communication channel. Transceiver 100 of FIG. 1 and transceiver 200 of FIG. 2 may each operate according to flowchart 400. Other structural and operational embodiments will be apparent to persons skilled in the relevant art(s) based on the discussion regarding flowchart 400. Flowchart 400 is described as follows.

Flowchart 400 may begin with step 402. In step 402, a serial input signal is converted to first parallel signals in a high latency communication channel of a transceiver. For example, as described above with respect to FIG. 2, serial-to-parallel converter 204 of first communication channel 201 may receive and convert amplified analog serial input signal 236 to N first parallel signals 238.

In step 404, the first parallel signals are converted to second parallel signals in a low latency communication channel of the transceiver. For example, as described above with respect to FIG. 2, second mux 216 may receive and convert N first parallel signals 238 into M fourth parallel signals 252. The number of parallel signals to which first parallel signals 238 are converted by second demux 216 may be in accordance to a second demux ratio associated with second demux 216. The second demux ratio may be defined by the number of inputs coming into demux 206 and the number of outputs coming out of demux 206. The second demux ratio may be selectable, thereby allowing the second demux ratio to be tuned to achieve the desired latency.

In step 406, the second parallel signals are buffered in a FIFO of the low latency communication channel according to a FIFO depth associated with the FIFO and a delayed version of the second parallel signals are output from FIFO. For example, as described above with respect to FIG. 2, M fourth parallel signals 252 are buffered in FIFO 218 of second communication channel 203. In this example, the FIFO depth of FIFO 218 is M (i.e., the number of fourth parallel signals 252 being output from second demux 216).

In an embodiment, the FIFO depth for FIFO 218 is modifiable or "programmable". For example, as described above with respect to FIG. 3, FIFO 218 may include depth adjuster logic 304, which is configured to receive FIFO depth selection signal 308. FIFO depth selection signal 308 may be provided by configuration register 302 upon receiving a configuration write operation that writes a value indicative of the selected FIFO depth of FIFO 218. Depth adjuster logic 304 modifies the number of buffers that are made available in FIFO 218 (e.g., via modification signal 310) in response to receiving FIFO depth selection signal 308.

In step 408, one of the first parallel signals from the high latency communication channel or the delayed version of the second parallel signals form the low latency communication channel are selected for conversion to a serial output signal. For example, as described above with respect to FIG. 2, parallel-to-serial converter 212 may receive L third parallel signals 244 from first communication channel 201 and L fifth parallel signals 256 from second communication channel 203. L fifth parallel signals 256 may be converted from delayed M fourth parallel signals 254 via second mux 220. Delayed M fourth parallel signals 254 may be provided by FIFO 218. Parallel-to-serial converter 212 may select one of L third parallel signals 244 of first communication channel 201 and L fifth parallel signals 256 of second communication channel 203 for conversion to serial output signal 246. The determination as to whether parallel-to-serial converter 212 converts L third parallel signals 244 or L fifth parallel signals 256 to serial output signal 246 may be based on a mode select signal (not depicted) received by parallel-to-serial converter 212. The mode select signal may indicate whether transceiver 200 is to execute in a high latency mode or a low latency mode. For example, if mode select signal is a first value (e.g., "0" (zero) or other corresponding value), then transceiver 200 may be configured to execute in high latency mode, where serial input signal 234 is de-serialized and serialized via first communication channel 201. In high latency mode, parallel-to-serial converter 212 may be configured to select L third parallel signals 244 for conversion to serial output signal 246. If mode select signal is a second value (e.g., "1" (one) or other corresponding value), then transceiver 200 may be configured to execute in low latency mode, where serial input signal 234 is de-serialized and serialized at least in part via second communication channel 203. In low latency mode, parallel-to-serial converter 212 may be configured to select L fifth parallel signals 256 for conversion to serial output signal 246.

Example Transceiver Including a High Latency Communication Channel and a Low Latency Communication Channel with Delay-Locked Loop (DLL)

A FIFO having a larger FIFO depth, such as FIFO 232 of first communication channel 201, generally can tolerate a large phase offset between the write clock used to write data to the FIFO and the read clock used to read data from the FIFO due to the slower speeds at which they operate. However, a FIFO having a reduced FIFO depth, such as FIFO 218 of second communication channel 203, may have a limited tolerance for phase offset between its read and write clock signals due to the faster speeds at which they operate. This may result in sampling errors in certain environments, particularly where the FIFO depth is selected to be relatively low. As such, in an embodiment, a DLL may be utilized to compensate for a phase difference between the read and write clock signals of a FIFO having a reduced FIFO depth.

Figure 5:
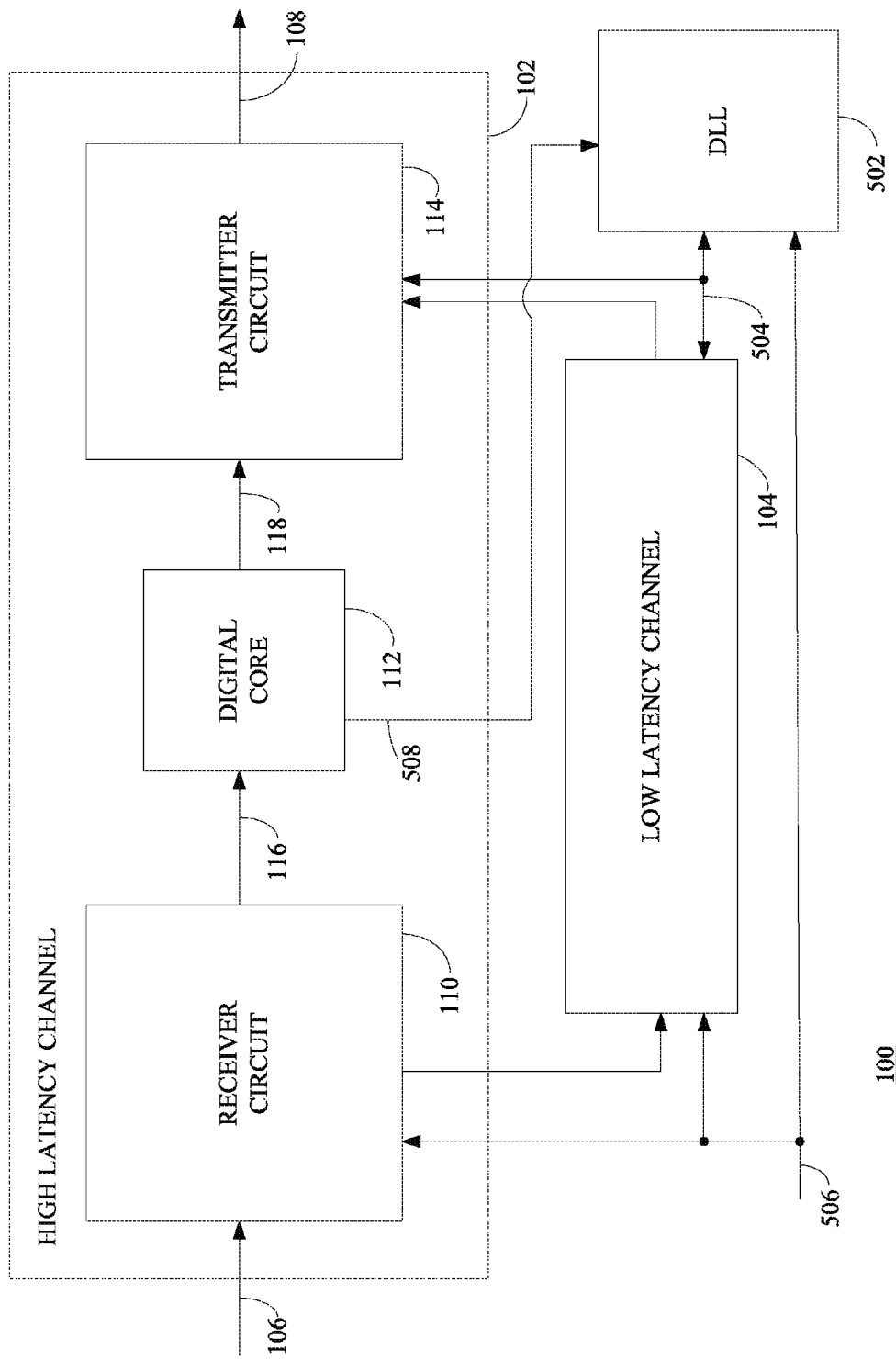
FIG. 5 depicts a block diagram of a transceiver that includes a delay-locked loop (DLL), according to an example embodiment.

FIG. 5 depicts that transceiver 100 may also include a DLL 502, in accordance to an embodiment. DLL 502 may be configured to phase align a transmitter clock signal 504 with a receiver clock signal 506. Receiver clock signal 506 may be a phase adjusted master clock signal (not shown) that has been adjusted to match the phase of a clock signal recovered from serial input signal (e.g., serial input signal 106). Receiver clock signal 506 may be received by a FIFO (not shown in FIG. 5; e.g., FIFO 218 of FIG. 2) included in low latency channel 104 via a write clock input of the FIFO. The FIFO may have a reduced FIFO depth. Transmitter clock signal 504 may be a phase adjusted master clock signal that has been adjusted to match the phase of receiver clock signal 506. Transmitter clock signal 504 may be received via a read clock input of the FIFO included in low latency channel 104. Transmitter clock signal 504 may be adjusted according to a control signal 506 received from digital core 112. Control signal 506 may indicate the number of degrees (e.g., 0 to 360 degrees, or additional degrees) that the master clock signal is to be adjusted. Additional details concerning the structure, function, and operation of an example embodiment of DLL 502 will be provided below in reference to FIGS. 6-8.

Figure 6:
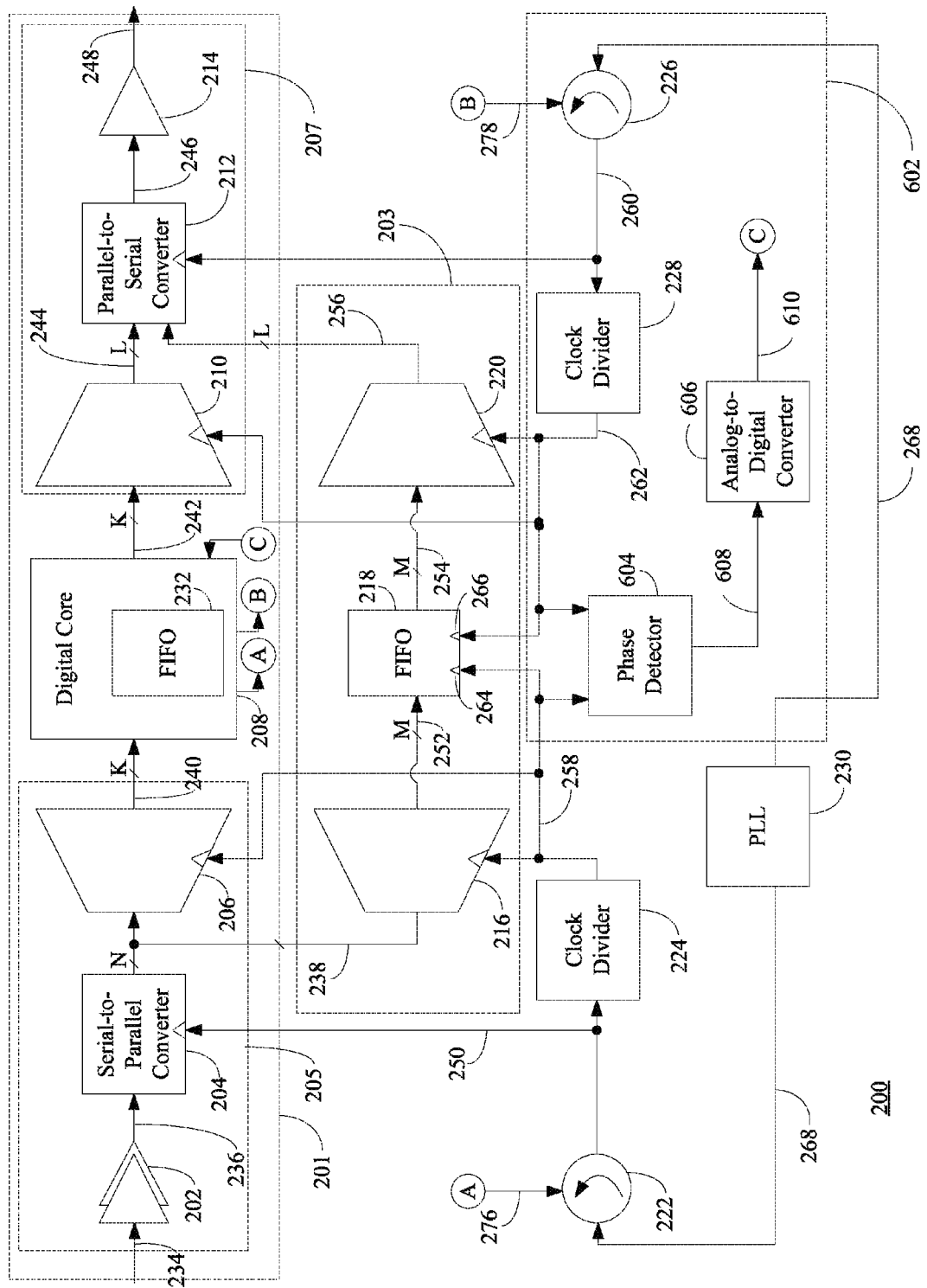
FIG. 6 depicts a detailed block diagram of the transceiver of FIG. 5, according to an embodiment.

FIG. 6 depicts a detailed block diagram of transceiver 200 that includes a DLL 602, according to an embodiment. DLL 602 is an example of DLL 502. DLL 602 may be configured to phase align divided transmitter clock signal 262 with divided receiver clock signal 258. As shown in FIG. 6, DLL 602 includes second phase interpolator 226, clock divider 228, phase detector 604, analog-to-digital converter 606, and components from digital core 208 (described below in reference to FIG. 7) that provide second control signal 278.

Phase detector 604 may be configured to detect a phase difference between divided receiver clock signal 258 and divided transmitter clock signal 262. In an embodiment, phase detector 604 may be a flip-flop (e.g., a D flip-flop), while in other embodiments phase detector 604 may be a latch, a register, or the like. Phase detector 604 may receive divided receiver clock signal 258 and divided transmitter clock signal 262 as inputs. In some embodiments, for example, when phase detector 604 is a D flip-flop, divided receiver clock signal 258 may be input as the clock for phase detector 604 (e.g., received at a clock port of the D flip-flop), and divided transmitter clock signal 262 may be input as the data for phase detector 604 (e.g., received at a data port of the D flip-flop). Phase detector 604 may output a phase difference signal 608 indicating a difference in phase between divided receiver clock signal 258 and divided transmitter clock signal 262 (e.g., at the D output port when phase detector 604 is a D flip-flop). For example, in the case where the phase of divided transmitter clock signal 262 leads the phase of divided receiver clock signal 258, phase difference signal 608 may be represented as a "1" (one) or a logic "high" signal. In the case where the phase of divided transmitter clock signal 262 lags the phase of receiver clock signal 258, phase difference signal 608 may be represented as a "0" (zero) or a logic "low" signal. It is contemplated that in various embodiments, according to design considerations, phase difference signal 608 maybe a "1" for a lagging phase and a "0" for a leading phase. Phase detector 604 may provide phase difference signal 608 to analog-to-digital converter 606, which converts phase difference signal 608 to a digital version of phase difference signal 608 (i.e., digital phase difference signal 610) and provides digital phase difference signal 610 to digital filter 702 of digital core 208. Analog-to-digital converter 606 may be configured in various ways in embodiments, such as being a demultiplexor. In an embodiment, analog-to-digital converter 606 may also slow down the data rate of digital phase difference signal 610 before providing digital phase difference signal 610 to digital core 208. Additional details concerning the structure, function, and operation of digital core 208 with respect to digital phase difference signal 610 be provided below in reference to FIG. 7.

Figure 7:
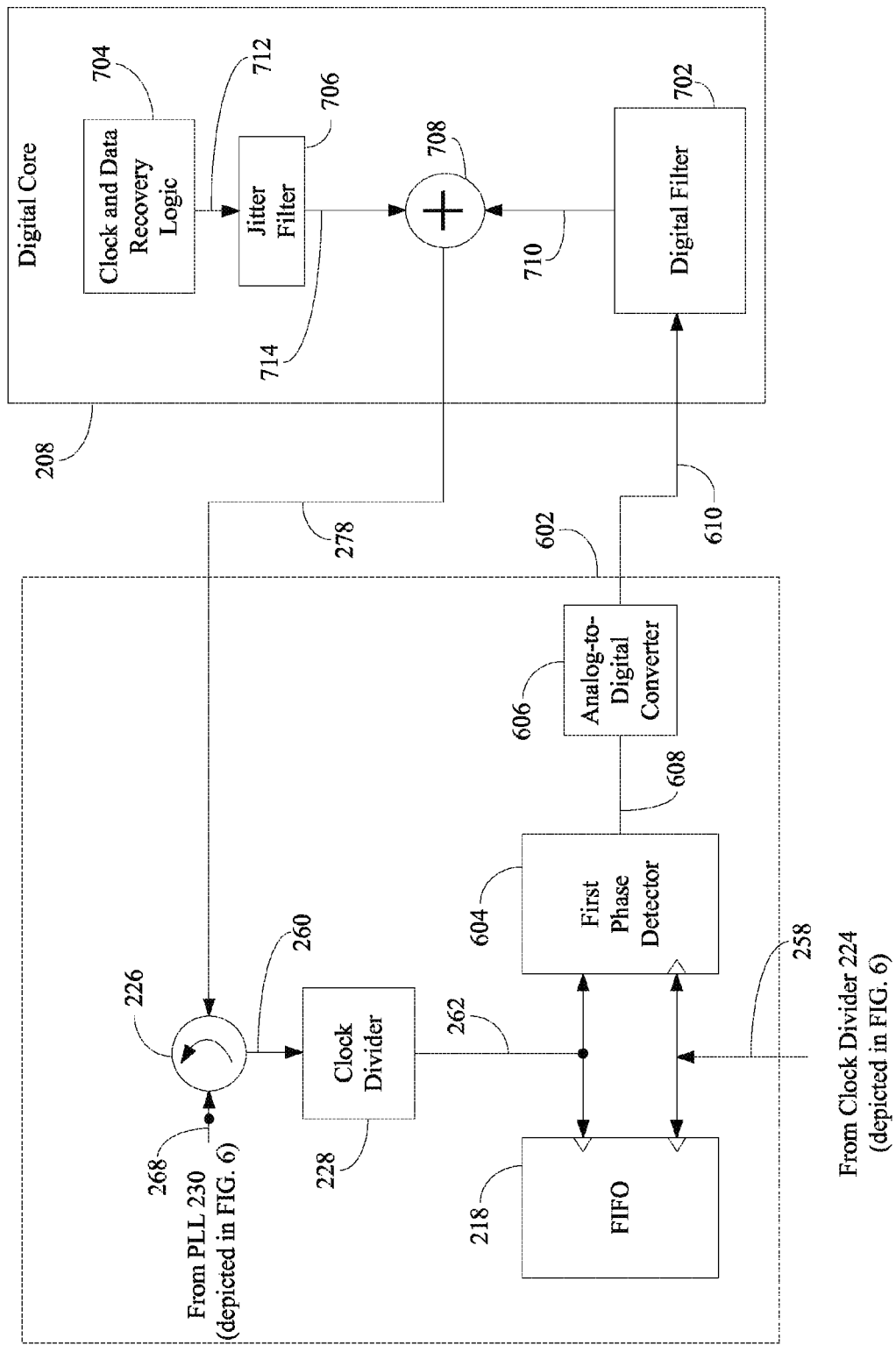
FIG. 7 depicts a block diagram of a digital core coupled to a DLL, according to an example embodiment.

FIG. 7 depicts a block diagram of digital core 208 coupled to DLL 602. As shown in FIG. 7, digital core 208 includes a digital filter 702, clock and data recovery logic 704, a jitter filter 706, and selection logic 708. Digital filter 702 may be configured to receive digital phase difference signal 610 as an input, and may output phase adjustment signal 710. For example, digital filter 702 may detect that digital phase difference signal 610 includes a long string of "1"s or a long string of "0"s that indicates a significant phase difference between divided transmitter clock signal 262 and divided receiver clock signal 258, and may therefore generate phase adjustment signal 710 to cause second phase interpolator 226 to adjust the phase of master clock signal 268 accordingly. Digital filter 702 may filter out a frequent switching between "1"s and "0"s (relatively short duration strings of "1"s and "0"s) in digital phase difference signal 610 as indicating that a phase difference between divided transmitter clock signal 262 and divided receiver clock signal 258 is in an acceptable range. Phase adjustment signal 710 may indicate a number of degrees (e.g., 0 to 360 degrees) that master clock signal 268 is to be adjusted via second phase interpolator 226. Phase adjustment signal 710 is received by selection logic 708.

Clock and data recovery logic 704 may be configured to recover a clock signal received via serial input signal 234 and compare the edge transitions between the recovered clock signal and a clock signal local to transceiver 200 (e.g., master clock signal 268) to determine a difference in phase between these clock signals. Clock and data recovery logic 704 may output a phase comparator signal 712 that indicates this difference in phase. Phase comparator signal 712 may be received by jitter filter 706. Jitter filter 706 may be configured to remove jitter detected from phase comparator signal 712 and provide a clean phase comparator signal 714 to selection logic 708.

In one embodiment, selection logic 708 is configured to select either phase adjustment signal 710 or phase comparator signal 712. The selected signal is received by second phase interpolator 226 as second control signal 278. For instance, in an embodiment, phase adjustment signal 710 may be selected when transceiver 200 is operating in a low latency mode, whereas phase comparator signal 712 may be selected when transceiver 200 is operating in a high latency mode. In another embodiment, selection logic 708 may combine phase adjustment signal 710 and phase comparator signal 712 and provide the combined signal to second phase interpolator 226 via second control signal 278.

Figure 8:
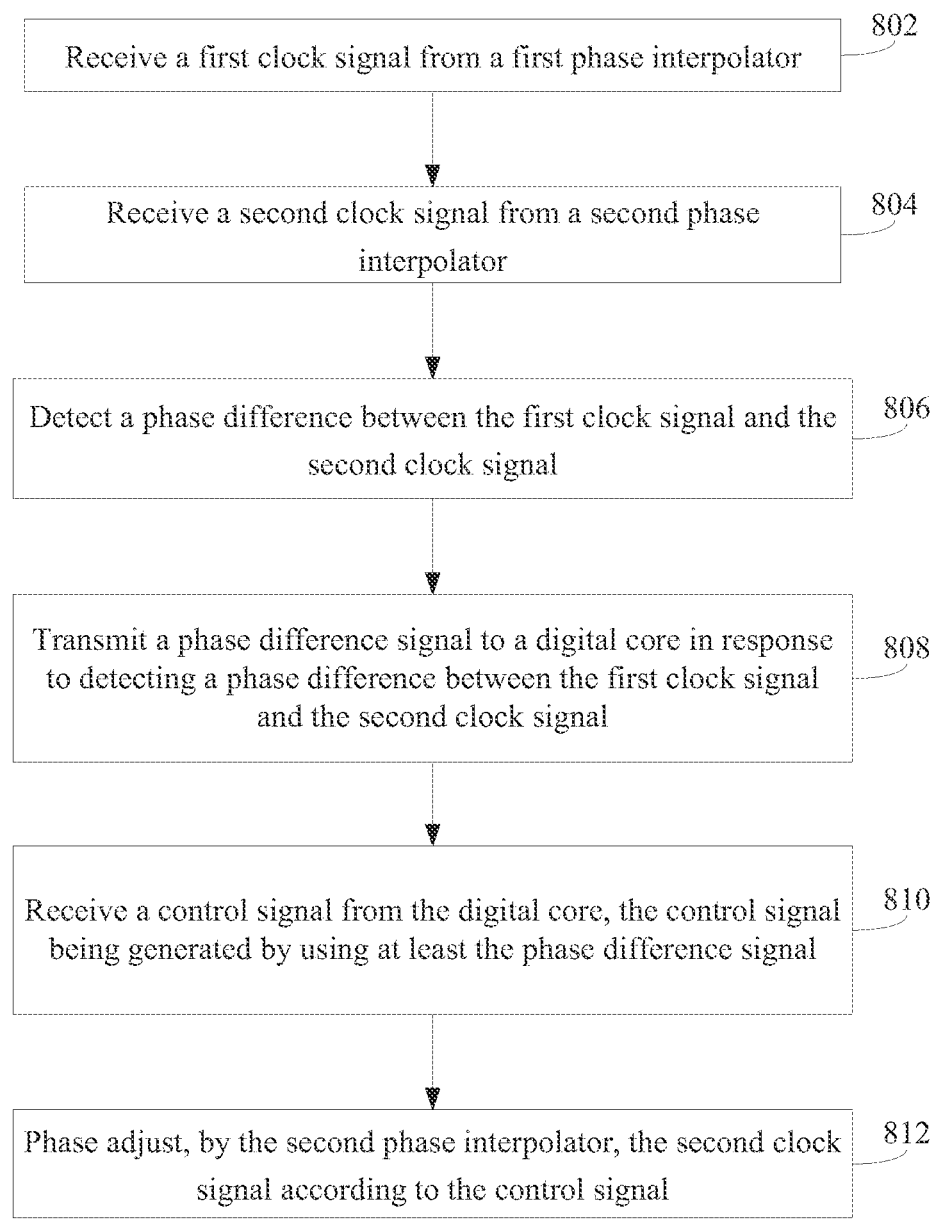
FIG. 8 shows a flowchart providing example steps for phase aligning a divided transmitter clock signal with a divided receiver clock signal, according to an embodiment.

Accordingly, in embodiments, the above-described transceivers may operate in various ways to phase align divided transmitted clock signal 262 with divided receiver clock signal 258. For example, FIG. 8 shows a flowchart 800 providing an example process for phase aligning divided transmitted clock signal 262 with divided receiver clock signal 258. Transceiver 100 of FIG. 5, transceiver 200 of FIG. 6, and the transceiver portion of FIG. 7 may each operate according to flowchart 800. Other structural and operational embodiments will be apparent to persons skilled in the relevant art(s) based on the discussion regarding flowchart 800. Flowchart 800 is described as follows.

Flowchart 800 may begin with step 802. In step 802, a first clock signal is received from a first phase interpolator. For example, as described above with respect to FIG. 6, phase detector 604 may receive a divided receiver clock signal 258, which is a divided version of receiver clock signal 250 provided by first phase interpolator 222.

In step 804, a second clock signal is received from a second phase interpolator. For example, as described above with respect to FIG. 6, phase detector 604 may receive a divided transmitter clock signal 262, which is a divided version of transmitter clock signal 260 provided by second phase interpolator 226.

In step 806, a phase difference is detected between the first clock signal and the second clock signal. For example, as described above with respect to FIG. 6, phase detector 604 may be configured to detect a phase difference between divided receiver clock signal 258 and divided transmitter clock signal 262.

In step 808, a phase difference signal is transmitted to a digital core in response to detecting a phase difference between the first clock signal and the second clock signal. For example, as described above with respect to FIG. 6, phase detector 604 may receive divided receiver clock signal 258 and divided transmitter clock signal 262 as inputs. Phase detector 604 may output to digital core 208 a phase difference signal 608 indicating a difference in phase between divided receiver clock signal 258 and divided transmitter clock signal 262. For example, in the case where the phase of divided transmitter clock signal 262 leads the phase of divided receiver clock signal 258, phase difference signal 608 may be represented as a "1" (one) or a logic "high" signal. In the case where the phase of divided transmitter clock signal 262 lags the phase of receiver clock signal 258, phase difference signal 608 may be represented as a "0" (zero) or a logic "low" signal.

It is contemplated that in various embodiments, according to design considerations, phase difference signal 608 maybe a "1" for a lagging phase and a "0" for a leading phase.

In an embodiment, the phase difference signal is converted to a digital signal before transmitting the phase difference signal to the digital core. For example, as described above with respect to FIG. 7, phase detector 604 may provide phase difference signal 608 to analog-to-digital converter 606, which converts phase difference signal 608 to a digital version of phase difference signal 608 (i.e., digital phase difference signal 610) and provides digital phase difference signal 610 to digital filter 702 of digital core 208.

In step 810, a control signal is received from the digital core. The control signal is generated by using at least the phase difference signal. For example, as described above with respect to FIG. 7, second phase interpolator 226 receives second control signal 278 via selection logic 708 of digital core 208. Digital filter 702 of digital core 208 may be configured to receive digital phase difference signal 610 as an input, and may output phase adjustment signal 710. For example, digital filter 702 may detect that digital phase difference signal 610 includes a long string of "1"s or a long string of "0"s that indicates a significant phase difference between divided transmitter clock signal 262 and divided receiver clock signal 258, and may therefore generate phase adjustment signal 710 to cause second phase interpolator 226 to adjust the phase of master clock signal 268 accordingly. Digital filter 702 may filter out a frequent switching between "1"s and "0"s (relatively short duration strings of "1"s and "0"s) in digital phase difference signal 610 as indicating that a phase difference between divided transmitter clock signal 262 and divided receiver clock signal 258 is in an acceptable range (e.g., the numbers of "1"s and "0"s in a predetermined number of samples on digital phase difference signal 610 are below corresponding predetermined threshold values). Phase adjustment signal 710 may indicate a number of degrees (e.g., 0 to 360 degrees, or additional degrees) that master clock signal 268 is to be adjusted via second phase interpolator 226. Phase adjustment signal 710 is received by selection logic 708. In one embodiment, selection logic 708 is configured to select phase adjustment signal 710 to be received by second phase interpolator 226 via second control signal 278 when transceiver 200 is operating in a low latency mode.

In step 812, the second phase interpolator phase adjusts the second clock signal according to the control signal. For example, with respect to FIG. 7, second phase interpolator 226 receives second control signal 278 and phase adjusts divided transmitter clock signal 262 according to second control signal 278 to generate transmitter clock signal 260.

In this manner, a DLL loop formed by first phase detector 604, analog-to-digital converter 606 (e.g., a demultiplexor), digital filter 702, selection logic 708, and phase interpolator 226 corrects the phase offset between the receiver clock and transmitter clock (divided receiver clock signal 258 and divided transmitter clock signal 262). For instance, this may compensate for phase offset and phase drift between the receiver and transmitter clocks.

Further Example Embodiments

Communication systems may include various types of devices that include transceivers to communicate data between a variety of devices. Embodiments described herein may be included in transceivers of such devices. For instance, embodiments may be included in mobile devices (laptop computers, handheld devices such as mobile phones (e.g., cellular and smart phones), handheld computers, handheld music players, and further types of mobile devices), desktop computers and servers, computer networks, and telecommunication networks.

Embodiments can be incorporated into various types of communication systems, such as intra-computer data transmission structures (e.g., Peripheral Component Interconnect (PCI) Express bus), telecommunication networks, traditional and wireless local area networks (LANs and WLANs), wired and wireless point-to-point connections, optical data transmission systems (e.g., short haul, long haul, etc.), high-speed data transmission systems, coherent optical systems and/or other types of communication systems using transceivers.

CONCLUSION

While various embodiments have been described above, it should be understood that they have been presented by way of example only, and not limitation. It will be apparent to persons skilled in the relevant art that various changes in form and detail can be made therein without departing from the spirit and scope of the embodiments. Thus, the breadth and scope of the embodiments should not be limited by any of the above-described exemplary embodiments, but should be defined only in accordance with the following claims and their equivalents.

What is claimed is:

1. A transceiver, comprising:
   a high latency communication channel; and
   a low latency communication channel that is a bypass channel for the high latency communication channel, the high latency communication channel comprising:
      a digital core,
      a receiver circuit configured to convert a serial input signal to first parallel signals, and
      a transmitter circuit; and
   the low latency communication channel comprising:
      a demultiplexor configured to convert the first parallel signals to second parallel signals, and
      a first-in first-out (FIFO) configured to receive and buffer the second parallel signals according to a FIFO depth and output a delayed version of the second parallel signals;
   wherein one of the first parallel signals from the high latency communication channel or the delayed version of the second parallel signals from the low latency communication channel is selected for conversion to a serial output signal.

2. The transceiver of claim 1, further comprising:
   a first phase interpolator configured to receive a first clock signal and a first control signal from the digital core, and generate a receiver clock signal that is a first version of the first clock signal that is phase adjusted according to the first control signal, wherein the receiver circuit is configured to receive the receiver clock signal; and
   a second phase interpolator configured to receive the first clock signal and a second control signal from the digital core, and generate a transmitter clock signal that is a second version of the first clock signal that is phase adjusted at least according to the second control signal, wherein the transmitter circuit is configured to receive the transmitter clock signal;
   wherein the first FIFO has a write clock input configured to receive the receiver clock signal and has a read clock input configured to receive the transmitter clock signal.

3. The transceiver of claim 1, wherein the first FIFO includes:
   a depth adjuster logic configured to receive a FIFO depth selection signal;
   wherein the depth adjustor circuit is configured to modify a depth of the first FIFO according to the received FIFO depth selection signal.

4. The transceiver of claim 2, further comprising a delay-locked loop (DLL) configured to phase align the transmitter clock signal with the receiver clock signal.

5. The transceiver of claim 4, wherein the DLL comprises a phase detector configured to output a phase difference signal to the digital core in response to detecting a phase difference between the transmitter clock signal and the receiver clock signal; and
   wherein the digital core is configured to generate the second control signal based at least on a recovered clock signal and the phase difference signal.

6. The transceiver of claim 1, wherein the high latency communication channel further comprises:
   a second demultiplexor configured to convert the first parallel signals to third parallel signals, and
   a second FIFO configured to receive and buffer the third parallel signals according to a second FIFO depth and output a delayed version of the third parallel signals;
   wherein one of the delayed version of the third parallel signals from the high latency communication channel or the delayed version of the second parallel signals from the low latency communication channel is selected for conversion to a serial output signal.

7. The transceiver of claim 6, wherein the number of signals in the second parallel signals is less than the number of signals in the third parallel signals.

8. The transceiver of claim 6, wherein the first FIFO depth is less than the second FIFO depth.

9. The transceiver of claim 6, wherein the third parallel signals received by the second FIFO are digital signals.

10. A method, comprising:
    converting a serial input signal to first parallel signals in a high latency communication channel of a transceiver;
    converting the first parallel signals to second parallel signals in a low latency communication channel of the transceiver, the low latency communication channel being a bypass channel for the high latency communication channel;
    buffering the second parallel signals in a first-in first-out (FIFO) of the low latency communication channel according to a FIFO depth and outputting a delayed version of the second parallel signals; and
    selecting one of the first parallel signals from the high latency communication channel or the delayed version of the second parallel signals from the low latency communication channel for conversion to a serial output signal.

11. The method of claim 10, further comprising:
    phase adjusting a first clock signal to generate a receiver clock signal according to a first control signal, the receiver clock signal being received via a write clock input of the first FIFO; and
    phase adjusting the first clock signal to generate a transmitter clock signal according to at least a second control signal; the transmitter clock signal being received via a read clock input of the first FIFO.

12. The method of claim 11, further comprising:
modifying a depth of the first FIFO.

13. The method of claim 12, further comprising phase aligning the transmitter clock signal with the receiver clock signal.

14. The method of claim 13, further comprising:
- detecting a phase difference between the transmitter clock signal and the receiver clock signal;
- transmitting a phase difference signal in response to detecting a phase difference between the transmitter clock signal and the receiver clock signal; and
- generating the second control signal using at least the phase difference signal.

15. The method of claim 10, further comprising:
- converting the first parallel signals to third parallel signals in the high latency communication channel;
- buffering the third parallel signals in a second FIFO of the high latency communication channel according to a second FIFO depth and outputting a delayed version of the third parallel signals; and
- selecting one of the delayed version of the third parallel signals from the high latency communication channel or the delayed version of the second parallel signals from the low latency communication channel for conversion to a serial output signal.

16. The method of claim 15, wherein the number of signals in the second parallel signals is less than the number of signals in the third parallel signals.

17. The method of claim 15, wherein the first FIFO depth is less than the second FIFO depth.

18. The method of claim 15, wherein the third parallel signals received by the second FIFO are digital signals.

19. A method, comprising:
- receiving a receiver clock signal, used for receiving data by a transceiver, from a first phase interpolator;
- receiving a transmitter clock signal, used for transmitting data from the transceiver, from a second phase interpolator;
- detecting a phase difference between the receiver clock signal and the transmitter clock signal;
- transmitting a phase difference signal to a digital core in response to detecting a phase difference between the receiver clock signal and the transmitter clock signal;
- receiving a control signal from the digital core, wherein the control signal is generated using at least the phase difference signal; and
- phase adjusting, by the second phase interpolator, the transmitter clock signal according to the control signal.

20. The method of claim 19, further comprising:
- converting the phase difference signal to a digital signal before transmitting the phase difference signal to the digital core.

* * * * *